United States Patent [19]

Kawagai et al.

[11] 4,129,792
[45] Dec. 12, 1978

[54] DRIVER BUFFER CIRCUIT USING DELAY INVERTERS

[75] Inventors: Kenji Kawagai; Shigeki Yoshida, both of Kawasaki, Japan

[73] Assignee: Tokyo Shibaura Electric Co., Ltd., Tokyo, Japan

[21] Appl. No.: 802,136

[22] Filed: May 31, 1977

[30] Foreign Application Priority Data

May 31, 1976 [JP] Japan .................................. 51-63067

[51] Int. Cl.² ..................... H03K 17/60; H03K 17/16; H03K 4/48; H03K 6/04
[52] U.S. Cl. ................................ 307/270; 307/200 B; 307/208; 307/227; 307/251; 307/263
[58] Field of Search ............... 307/208, 214, 251, 263, 307/227, 270, 311, 200 B; 328/156, 157, 186

[56] References Cited

U.S. PATENT DOCUMENTS

| | | | |
|---|---|---|---|
| 2,858,434 | 10/1958 | Tollefson | 328/186 |
| 3,378,783 | 4/1968 | Gibson | 307/214 X |
| 3,835,403 | 9/1974 | Leinemann | 328/186 |
| 3,857,045 | 12/1974 | Low et al. | 307/208 |
| 3,942,162 | 3/1976 | Buchanan | 307/DIG. 4 X |
| 3,996,481 | 12/1976 | Chu et al. | 307/DIG. 4 X |

*Primary Examiner*—Larry N. Anagnos
*Attorney, Agent, or Firm*—Finnegan, Henderson, Farabow & Garrett

[57] ABSTRACT

A driver circuit which comprises a driver stage; an inverter stage formed of an even number of mutually cascade connected inverters and connected to the output side of said driver stage; a first switching element rendered conducting or nonconducting according to a level of an output signal being received from said driver stage; and a second switching element rendered conducting or nonconducting according to a level of an output signal being received from said inverter stage.

7 Claims, 7 Drawing Figures

DRIVER BUFFER CIRCUIT USING DELAY INVERTERS

BACKGROUND OF THE INVENTION

This invention relates to a driver circuit capable of preventing current flowing therethrough from sharply increasing when a load begins to be operated.

In recent years, electronic timepieces have come to be built in various types of electrical devices. The electronic timepieces include a display element formed of, for example, a light-emitting diode (abbreviated as "LED"). Such light-emitting element used as a load sends forth light beams upon introduction of current through a driver circuit. When the load begins to be operated, current flowing through the driver circuit sharply increases with the resultant occurrence of harmonics, and sometimes noises in other circuits included in an electrical device. Where an electrical device containing an electronic timepiece is an acoustic device such as a stereophonic system or a radio receiver, then the above-mentioned noises exert a prominently harmful effect on the acoustic device from the standpoint of a high precision acoustic characteristic demanded of said acoustic device.

To date, a driver circuit has been proposed which can reduce to some extent the rapid rate at which current flowing through said driver circuit increases when a load begins to be operated.

With the prior art driver circuit whose arrangement is schematically shown in FIG. 1, an inverter 6 is formed of the enhancement type P-channel field effect transistor 4 (hereinafter referred to as "FET") and depletion type P-channel FET 2. The gate of the P-channel FET 4 is connected to an input terminal 8. Connected to the output side of the inverter 6 is an enhancement type P-channel FET 10 acting as a switching element. The drain electrode of the P-channel FET 10 is connected to the output terminal 12 of said prior art driver circuit. With this driver circuit, the switching FET 10 is rendered conducting or nonconducting according to a level of an output signal being received from the inverter 6. This inverter 6 which includes the FETs 2,4 having a small mutual conductance Gm, has a small time constant. Because of the small time constant, the level of the voltage applied to the gate of switching FET 10 is elevated slowly, thereby decreasing the rapid rate at which current flowing through the driver circuit increases when a load begins to be operated.

FIG. 2 illustrates the input and output voltage characteristics of the prior art driver circuit, and FIG. 3 indicates the output current characteristic thereof. Referring to FIG. 2, referential character $V_{in}$ is a voltage signal supplied to the input terminal 8 of the prior art driver circuit shown in FIG. 1, and referential character $V_{out}$ is an output voltage signal from the inverter 6 which is impressed on the gate electrode of FET 10.

For operation of a load such as LED, the switching FET 10 should preferably be of the enhancement type. However, the enhancement type FET has an intrinsic property that where a gate voltage exceeds a threshold level, current flowing through said FET sharply rises. Therefore, the prior art driver circuit of FIG. 1 has the drawback that where an output voltage signal $V_{out}$ from the inverter 6 rises over the threshold voltage (indicated by character $V_{th}$ in FIG. 2) of the FET 10, then current passing through the FET 10 suddenly increases, as shown in FIG. 3.

SUMMARY OF THE INVENTION

This invention has been accomplished in view of the above-mentioned circumstances and is intended to provide a driver circuit capable of preventing current flowing through the driver circuit from sharply rising when a load begins to be operated.

According to an aspect of this invention, there is provided a driver circuit which comprises an input terminal; first and second power terminals; a driver stage connected to the input terminal of the driver circuit; an inverter stage formed of an even number of mutually cascade connected inverters and connected to the output side of the driver stage; a first switching element formed of a first field effect transistor having a gate electrode connected to the output terminal of the driver stage and first and second output electrodes and rendered conducting or nonconducting according to a level of an output signal being received from the driver stage; a second switching element formed of a second field effect transistor having a gate electrode connected to the output terminal of the inverter stage and first and second output electrodes being connected to the first and second output electrodes, respectively, of the first switching element and rendered conducting or nonconducting according to a level of an output signal being received from the inverter stage; the first power terminal coupled to the first output electrodes and an output terminal coupled to the second output terminals through which output signals from the first and second switching elements are drawn out.

DETAILED DESCRIPTION OF THE PREFERRED EMBODIMENT

Figure 1:
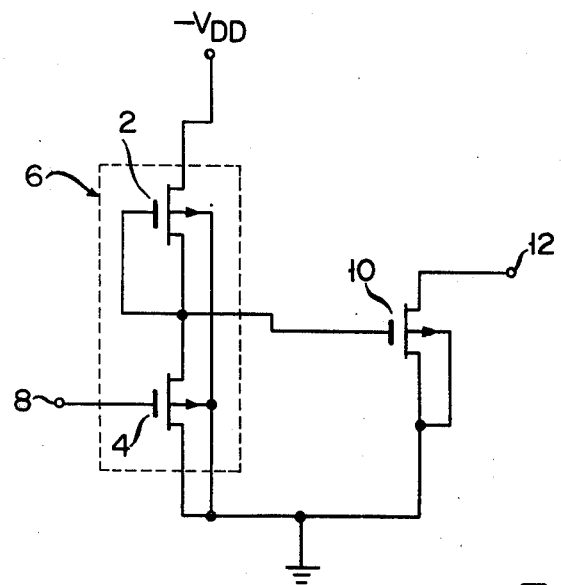
FIG. 1 schematically shows the prior art driver circuit.
Figure 2:
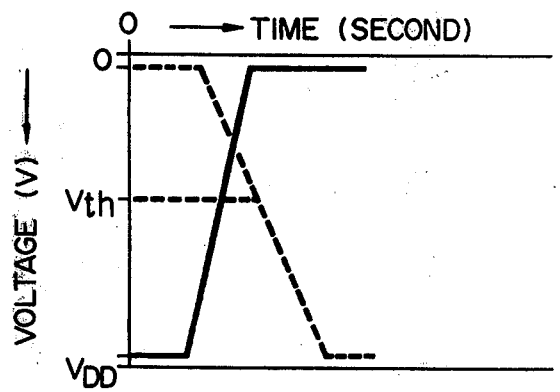
FIG. 2 indicates the input and output voltage characteristics of the prior art driver circuit of FIG. 1.
Figure 3:
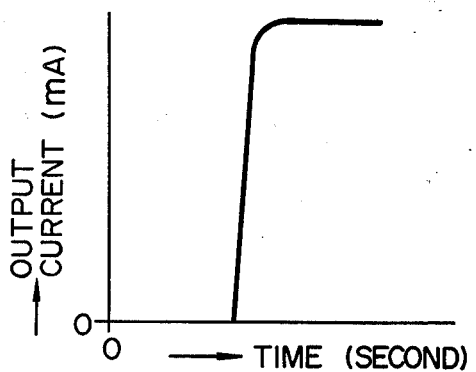
FIG. 3 presents the output current characteristic of the prior art driver circuit of FIG. 1.
Figure 4:
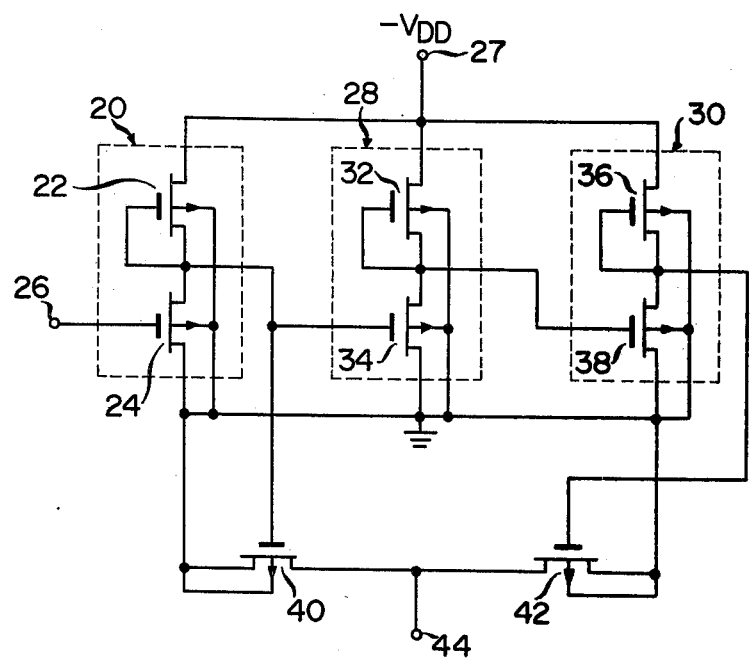
FIG. 4 sets forth the arrangement of a driver circuit according to one embodiment of this invention.

Referring to FIG. 4, a driver stage 20 enclosed in broken lines is formed of FET 22 acting as a load element and FET 24 acting as a driver element. The gate electrode of the FET 22 is connected to the source electrode thereof. The gate electrode of the FET 24 is connected to the input terminal 26 of the driver circuit. The drain electrode of the FET 22 is connected to a power source 27 having a voltage of $-V_{DD}$. The source electrode of the FET 22 is connected to the drain electrode of the FET 24, whose source electrode is connected to the ground. The substrates of both FET's 22, 24 are also connected to the ground. Referential numeral 28 denotes an inverter (enclosed in broken lines) formed of FET 32 acting as a load element and FET 34 acting as a driver element. Referential numeral 30 shows another inverter (enclosed in broken lines)

formed of FET 36 acting as a load element and FET 38 acting as a driver element.

Since the inverters 28, 30 have substantially the same arrangement as the driver stage, description is only given of the different arrangement of said inverters 28, 30 from the driver stage. The gate electrode of the FET 34 is connected to the drain electrode of the FET 24 of the driver stage. The drain electrode of the FET 34 is connected to the gate electrode of the FET 38 of the inverter 30. Referential numeral 40 denotes a switching element which is rendered conducting or nonconducting according to a level of an output signal being received from the driver stage 20. Referential numeral 42 represents a switching element which is rendered conducting or nonconducting according to a level of an output signal being received from the inverter 30. Both switching elements 40, 42 are formed at FETs. With the FET 40, the gate electrode is connected to the drain electrode of the FET 24 of the driver stage 20; the drain electrode is connected to the output terminal 44 of the driver circuit; and the source electrode is connected to the ground. With the FET 42, the gate electrode is connected to the drain electrode of the FET 38 of the inverter 30; the drain electrode is connected to the output terminal 44 of the driver circuit; the source electrode is connected to the ground; and the substrate is also connected to the ground.

Figure 5:
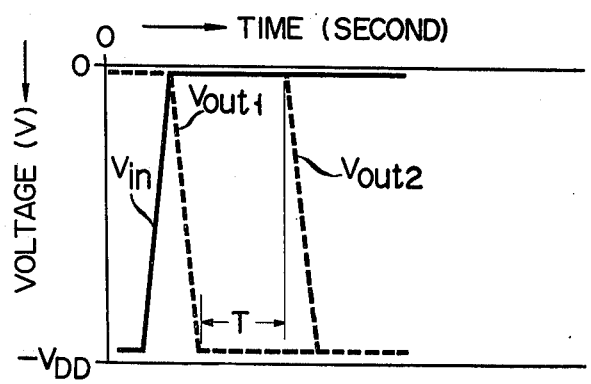
FIG. 5 is a curve diagram showing the input and output voltage characteristics of the present driver circuit of FIG. 4.
Figure 6:
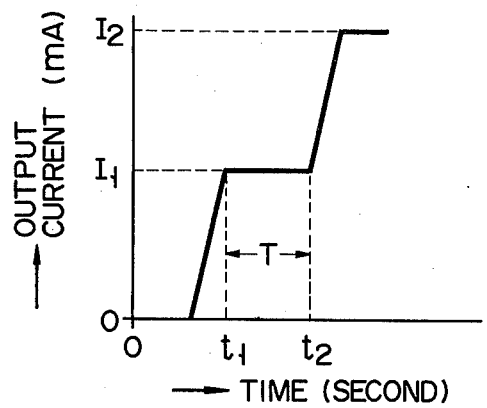
FIG. 6 is a curve diagram indicating the output current characteristic of the present driver circuit of FIG. 4.

The FETs 22, 32, 36 are depletion type P-channel metal oxide semiconductor FETs. The other FETs 24, 34, 38, 40, 42 are enhancement type P-channel metal oxide semiconductor FETs.

Where a driver circuit arranged as described above is used to operate LED built in, for example, an electronic timepiece, then the LED is connected to the output terminal 44, and the input terminal 26 is impressed with a voltage signal having a waveform denoted by referential character $V_{in}$ shown in FIG. 5. Where the input voltage signal $V_{in}$ is impressed on the driver circuit, a voltage signal having a waveform represented by referential character $V_{out\,1}$ shown in FIG. 5 is produced on the output side of the driver stage 20, that is, at the drain electrode of the FET 24. The voltage signal $V_{out\,1}$ is impressed on the gate electrode of the switching FET 40 for its operation. Said voltage signal $V_{out\,1}$ is also conducted to the gate electrode of the FET 34 of the first inverter 28. The voltage signal $V_{out\,1}$ supplied to the gate electrode of the FET 34 is drawn out in the form of a voltage signal $V_{out\,2}$ at the drain electrode of the FET 38 of the last stage inverter 30 at time $t_2$ (FIG. 6) after being delayed from the time $t_1$ (FIG. 6) at which said voltage signal $V_{out\,1}$ was initially generated by a total length of time required for said voltage signal $V_{out\,1}$ to rise and fall in each of the inverters 28, 30, namely, by a period T shown in FIGS. 5 and 6. Since the driver circuit of this invention comprises an even number of inverters, the voltage signal $V_{out\,2}$ has the same phase as the voltage signal $V_{out\,1}$. The voltage signal $V_{out\,2}$ is impressed on the gate electrode of the switching FET 42 for its operation. Thus, the switching FET 42 is put into operation after being delayed from the FET 40 by the aforesaid period T. An output current at the output terminal 44 of the subject driver circuit is expressed as a sum of the current flowing through the FET 40 and that flowing through the FET 42. As described above, a time interval equal to the aforesaid period T arises between the generation of the voltage signal $V_{out\,1}$ operating the FET 40 and that of the voltage signal $V_{out\,2}$ operating the FET 42. As naturally expected, therefore, a time interval equal to the aforesaid period T also takes place between the issue of an output current from the switching FET 40 and that of an output current from the switching FET 42. To describe in greater detail, when the FET 40 is operated at time $t_1$ by being impressed with the voltage signal $V_{out\,1}$, then an output current only from said FET 40 appears at the output terminal 44. Where the FETs 40, 42 have substantially the same switching characteristic, then said output current has a value $I_1$ equal to about half the final current value obtained through operation of both FETs 40, 42. Said output current continues to retain said value $I_1$ until the FET 42 is put into operation. Where the voltage signal $V_{out\,2}$ is supplied at time $t_2$, namely, at the end of the aforesaid period T, then the FET 42 is actuated, and an output current from said FET 42 is additionally supplied to the output terminal 44, finally providing a current having a value of $I_2$.

With the driver circuit of this invention in which the switching stage is formed of two switching elements 40, 42 as mentioned above, a length of time required for an output current from said driver circuit to reach a final value is prolonged by an interval between the point of time at which the switching element 40 begins to be operated and the point of time at which the switching element 42 begins to be operated, thereby reducing the rapid rate at which current flowing through the driver circuit increases.

Description of the embodiment of FIG. 4 refers to the case where all the FETs were of the P-channel type. Obviously, this invention is also applicable to a driver circuit in which all the FETs are of the N-channel type. In the latter case, the voltage polarity of the power source 27 should of course be reversed. Further, the FETs 22, 32, 36 may be of the enhancement type, and the driver stage 20 and inverters 28, 30 may respectively be formed of complementary FETs.

Figure 7:
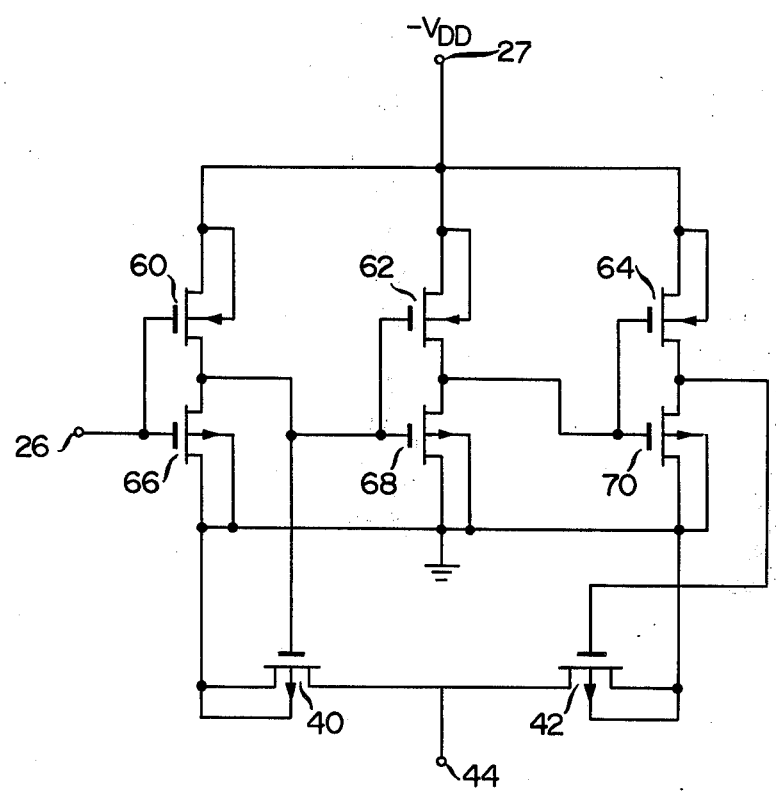
FIG. 7 is the arrangement of a driver circuit according to another embodiment of the invention.

There will now be described by reference to FIG. 7 a driver circuit according to another embodiment of this invention in which the driver stage and inverters are respectively formed of complementary FETs. FETs 60, 62, 64 are of the N-channel type, while FETs 66, 68, 70 are of the P-channel type. Conversely, however, the FETs 60, 62, 64 may be changed into the P-channel type, and the FETs 66, 68, 70 into the N-channel type. The driver circuit of FIG. 7 is operated in substantially the same manner as that of FIG. 4, further description being omitted.

What we claim is:

1. A driver circuit which comprises an input terminal; first and second power terminals; a driver stage connected to said input terminal of the driver circuit; an inverter stage formed of an even number of mutually cascade connected inverters and connected to the output side of said driver stage; a first switching element formed of a first field effect transistor having a gate electrode connected to the output terminal of said driver stage and first and second output electrodes and rendered conducting or nonconducting according to a level of an output signal being received from said driver stage; a second switching element formed of a second field effect transistor having a gate electrode connected to the output terminal of said inverter stage and first and second output electrodes being connected to said first and second output electrodes, respectively, of said first switching element and rendered conducting or nonconducting according to a level of an output signal being received from said inverter stage; said first power terminal coupled to said first output electrodes and an output terminal coupled to said second output electrodes through which output signals from said first and second switching elements are drawn out.

2. A driver circuit according to claim 1, wherein said driver stage and inverters are respectively formed of third field effect transistors connected to said second power terminal to act as load elements and fourth field effect transistors connected to said first power terminal to act as driver elements; said first output electrodes of said first and second field effect transistors comprising source electrodes connected to said first power terminal and said second output electrodes of said first and second field effect transistors comprising drain electrodes connected to said output terminal of the driver circuit.

3. The driver circuit according to claim 2, wherein said transistors are of the enhancement type.

4. The driver circuit according to claim 2, wherein said third transistors are of the depletion type; and said first, second, and fourth transistors are of the enhancement type.

5. The driver circuit according to claim 2, wherein said first, second, third and fourth field effect transistors are of the P-channel type; said first power terminal has a high voltage level; and said second power terminal has a low voltage level.

6. The driver circuit according to claim 2, wherein said first, second, third and fourth field effect transistors are of the N-channel type; said first power terminal has a low voltage level; and said second power terminal has a high voltage level.

7. The driver circuit according to claim 2, wherein the driver stage and said even number of inverters are respectively formed of complementary type field effect transistors.

* * * * *